(12) United States Patent
Hosono et al.

(10) Patent No.: US 6,972,996 B2
(45) Date of Patent: Dec. 6, 2005

(54) PATTERN LAYOUT OF TRANSFER TRANSISTORS EMPLOYED IN ROW DECODER

(75) Inventors: Koji Hosono, Yokohama (JP); Hiroshi Nakamura, Fujisawa (JP); Kenichi Imamiya, Tokyo (JP); Tomoharu Tanaka, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 10/922,950

(22) Filed: Aug. 23, 2004

(65) Prior Publication Data
US 2005/0018462 A1 Jan. 27, 2005

Related U.S. Application Data

(63) Continuation of application No. 10/706,909, filed on Nov. 14, 2003, now Pat. No. 6,798,683, which is a continuation of application No. 10/303,946, filed on Nov. 26, 2002, now Pat. No. 6,690,596, which is a continuation of application No. 09/984,960, filed on Oct. 31, 2001, now Pat. No. 6,507,508.

(30) Foreign Application Priority Data
Oct. 31, 2000 (JP) .............................. 2000-333719

(51) Int. Cl.⁷ ............................................. G11C 16/06

(52) U.S. Cl. ............... 365/185.23; 365/63; 365/230.06

(58) Field of Search ............................ 365/63, 185.23, 365/230.06

(56) References Cited

U.S. PATENT DOCUMENTS

| | | | | |
|---|---|---|---|---|
| 4,481,609 A | | 11/1984 | Higuchi et al. | ................ 365/72 |
| 5,402,386 A | * | 3/1995 | Tavrow et al. | ......... 365/230.06 |
| 5,523,980 A | * | 6/1996 | Sakui et al. | ........... 365/230.08 |
| 5,602,796 A | * | 2/1997 | Sugio | .................... 365/230.06 |
| 5,604,711 A | * | 2/1997 | Cheung | ................. 365/230.06 |
| 5,621,684 A | * | 4/1997 | Jung | ..................... 365/185.17 |

(Continued)

FOREIGN PATENT DOCUMENTS

JP 2000-76880 3/2000

*Primary Examiner*—Tan T. Nguyen
(74) *Attorney, Agent, or Firm*—Banner & Witcoff, Ltd.

(57) ABSTRACT

A semiconductor device comprises a memory cell array and a word-line select circuit. The memory cell array includes a plurality of memory cells arranged in rows and columns. The memory cell array includes a plurality of blocks in each one of which the memory cells are arranged. The word-line select circuit includes transfer transistors arranged in row and column directions, and is configured to transfer a plurality of different voltages to word lines through current paths of the transfer transistors and select memory cells of at least one row of said plurality of blocks. The transfer transistors include a first group, which transfers the lowest voltage of voltages applied to the word lines in a writing operation and a second group, which is arranged not to be adjacent to the first group and transfers the highest voltage of voltages applied to the word lines in a writing operation.

5 Claims, 11 Drawing Sheets

U.S. PATENT DOCUMENTS

| | | | |
|---|---|---|---|
| 5,706,245 A | 1/1998 | Kim | 365/63 |
| 5,715,194 A * | 2/1998 | Hu | 365/185.17 |
| 5,875,149 A | 2/1999 | Oh et al. | 365/63 |
| 5,896,340 A | 4/1999 | Wong et al. | 365/63 |
| 6,141,250 A | 10/2000 | Kashimura | 365/185.1 |
| 6,240,012 B1 | 5/2001 | Nakamura et al. | |
| 6,504,757 B1 * | 1/2003 | Hollmer et al. | 365/185.18 |
| 6,621,745 B1 | 9/2003 | Manea | 365/185.23 |
| 6,717,861 B2 | 4/2004 | Jeong et al. | 365/185.28 |
| 6,798,683 B2 * | 9/2004 | Hosono et al. | 365/63 |

* cited by examiner

PATTERN LAYOUT OF TRANSFER TRANSISTORS EMPLOYED IN ROW DECODER

CROSS-REFERENCE TO RELATED APPLICATIONS

This application is a Continuation of U.S. application Ser. No. 10/706,909 filed on Nov. 14, 2003 now U.S. Pat. No. 6,798,683: which is a Continuation of U.S. application Ser. No. 10/303,946 filed on Nov. 26, 2002 now U.S. Pat. No. 6,690,596; which is a Continuation of U.S. application Ser. No. 09/984,960 filed on Oct. 31, 2001 now U.S. Pat. No. 6,507,508, hereby incorporated by reference as to its entirety. This application is based upon and claims the benefit of priority from the prior Japanese Patent Application No. 2000-333719 filed Oct. 31, 2000, the entire contents of which are incorporated by reference.

BACKGROUND OF THE INVENTION

1. Field of the Invention

The present invention relates to a semiconductor storage device, and more particularly to the pattern layout of transfer transistors employed in a row decoder, which is used in a nonvolatile memory such as a NAND flash memory.

2. Description of the Related Art

A NAND flash memory is disclosed in, for example, Jin-Ki Kim et al, "A 120 mm² 64 Mb NAND Flash Memory Achieving 180 ns/Byte Effective Program Speed", Symposium on VLSI Circuits, Digest of Technical Papers, pp. 168–169, 1996.

Figure 1:
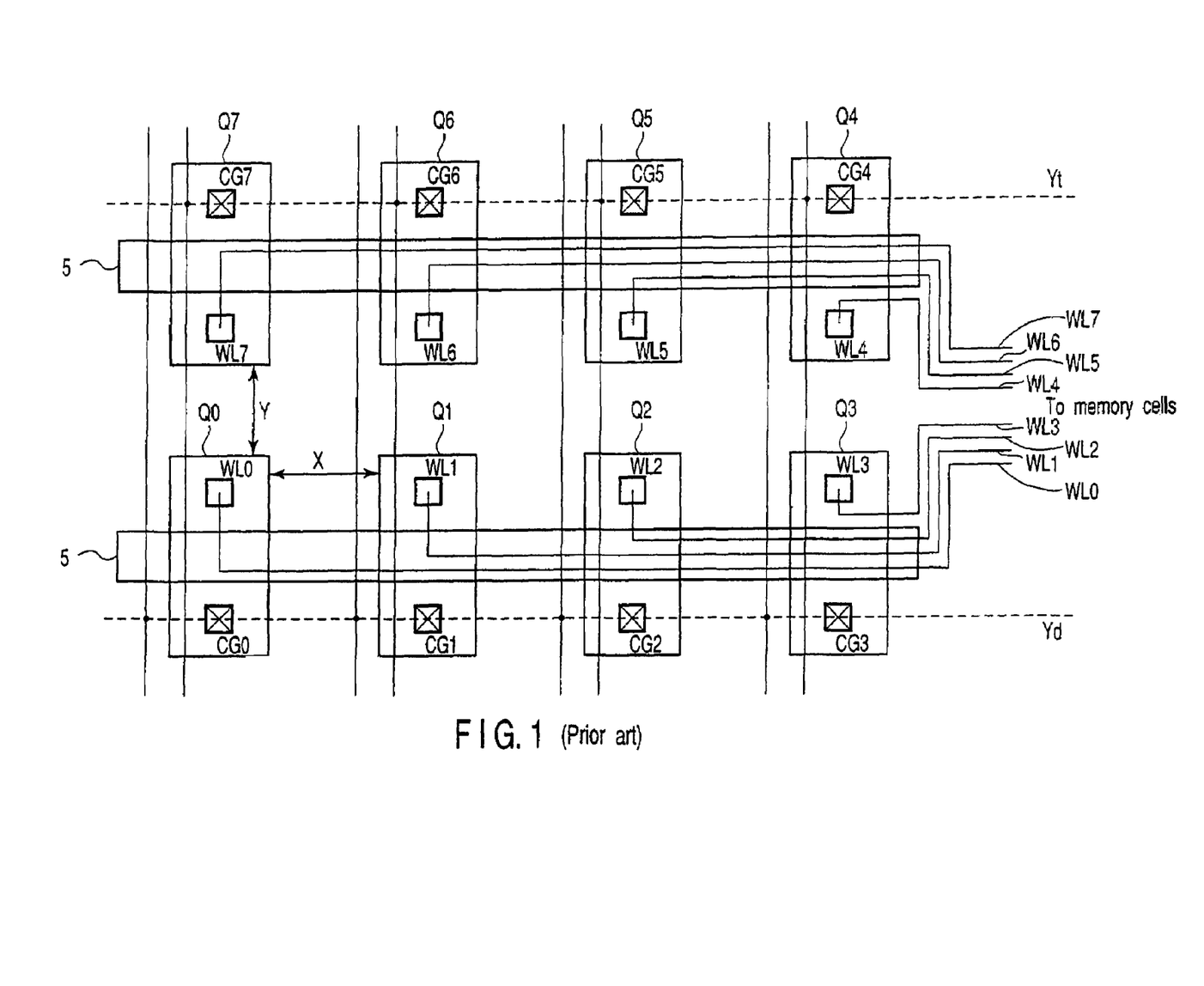
FIG. 1 is a plan view useful in explaining a conventional semiconductor memory device, showing a layout pattern of transfer transistors included in a row decoder and arranged in two stages.

FIG. 1 illustrates a pattern layout image of a transfer transistor section provided in the row decoder of the NAND flash memory. The transfer transistor section is used to transfer, to a selected block in a memory cell array, a word-line driving signal and a selected-gate driving signal corresponding to a word line address. For facilitating the drawing and explanation, a case where eight transfer transistors are employed will be taken here as an example.

In the case of FIG. 1, the distance between broken lines Yt and Yd is determined from the size of the NAND cell, and transfer transistors Q0 to Q7 are arranged in two stages. Each transfer transistor Q0 to Q7 is an N channel MOS (NMOS) transistor formed in a p-type substrate, and its source/drain region is sufficiently resistive against a write voltage (program voltage) and an erasure voltage applied thereto.

In the arrangement of the transfer transistors Q0 to Q7 shown in FIG. 1, when executing programming, 20V+Vth (the threshold voltage of each transfer transistor), 20V, 0V and 10V are applied to the transfer transistors Q0 to Q7, a selected one of word lines WL0 to WL7, each non-selected word line adjacent to the selected one, and the other non-selected word lines, respectively. In this voltage-applied state, when writing data "1" (programming data "1"), a power supply voltage Vdd is applied to a selected bit line, while when writing data "0" (programming data "0"), a ground voltage Vss is applied to the selected bit line.

Figure 2:
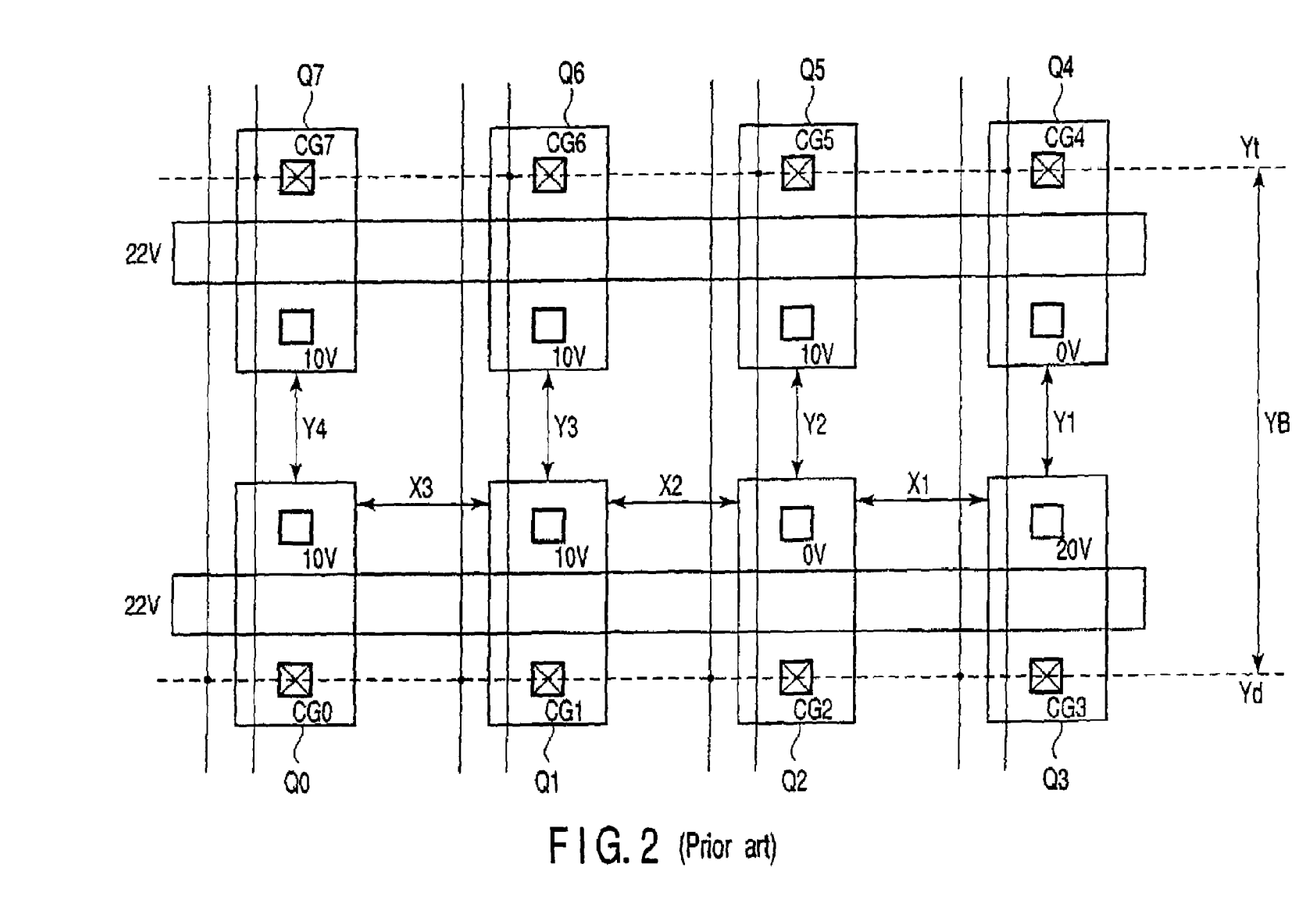
FIG. 2 is a plan view illustrating a pattern used to explain a biased state assumed when writing data.

The biased state assumed when programming data is shown in FIG. 2. In the case of FIG. 2, the word line WL3 corresponding to a word-line-driving-signal CG3 is selected. The non-selected word lines adjacent to the selected word line WL3 are the word lines WL2 and WL4.

In this biased state, the distance X1 between the transfer transistors Q2 and Q3, to which word-line driving signals CG2 and CG3 are supplied, respectively, must be set at a value that enables a leak current, which occurs in a field transistor using the transistor Q3 as its drain, the transistor Q2 as its source and the gate 5 as its gate, to be kept not more than a predetermined level. Further, the distance Y1 between the transfer transistors Q3 and Q4, to which word-line driving signals CG3 and CG4 are supplied, respectively, must be set at a value that enables a leak current not more than a predetermined level to occur when 20V has been applied to an n-type diffusion region formed in the p-type substrate between element-isolating regions.

In the case of selecting another word line, the same can be said of each distance X2, X3 and Y2 to Y4.

However, in the above-described pattern layout, if the distance YB is required to be set significantly small so as to satisfy the demand for reduction of memory cell size, the transfer transistors cannot be arranged in two stages, depending upon the distance X1 or Y1 that is determined from the device design or process. In this case, a larger number of transfer transistors must be arranged in one stage, which means that the row decoder may have a significantly long length.

As described above, in the conventional semiconductor memory device, transfer transistors, employed in its row decoder for applying a write voltage or an erasure voltage to the control gate of each memory cell, must have a size sufficient to resist the write voltage and the erasure voltage. Moreover, large element-isolating regions are also needed. This being so, the pattern area of the row decoder is inevitably large.

BRIEF SUMMARY OF THE INVENTION

According to an aspect of the present invention, there is provided a semiconductor memory device comprising a memory cell array including a plurality of memory cells arranged in rows and columns, the memory cell array having a plurality of blocks wherein within each block memory cells are arranged; and a word-line select circuit including transfer transistors arranged in row and column directions, and configured so as to transfer a plurality of different voltages to word lines through a current path of the transfer transistors and select memory cells in at least one row of said plurality of blocks, the transfer transistors including a first transistor which transfers the lowest voltage of voltages applied to the word lines in a writing operation, a second transistor which transfers the highest voltage of the voltages applied to the word lines in a writing operation, and a third transistor which is arranged between the first transistor and the second transistor and which is applied with an intermediate voltage between the highest voltage and the lowest voltage during a writing operation.

According to another aspect of the invention, there is provided a semiconductor memory device comprising: a memory cell array including a plurality of blocks, each of the blocks including memory cells arranged in rows and columns; a block select circuit configured to select one of the blocks of the memory cell array; a plurality of word-line-driving-signal lines to receive voltages to be applied to a plurality of word lines in each block; and a plurality of transfer transistors connected between the word-line-driving-signal lines and the word lines of the memory cell array, the transfer transistors being controlled by outputs from the block select circuit, a first element-isolation region, interposed between word-line-side terminals of some of the transfer transistors in the each block, having a narrower width than a second element-isolation region, interposed between word-line-side terminals and word-line-driving-signal line-side terminals of other transfer transistors in the each block.

According to still another aspect of the invention, there is provided a semiconductor memory device comprising: a memory cell array including electrically programmable non-volatile memory cells arranged in rows and columns; block select means for selecting one of blocks that are included in the memory cell array and each have a plurality of word lines; a plurality of word-line-driving-signal lines to receive voltages to be applied to a plurality of word lines in each block; and a plurality of transfer transistors having current paths thereof connected between the word-line-driving-signal lines and the word lines of the each block, the transfer transistors being controlled by outputs from the block select means, wherein any two of the transfer transistors, which correspond to each pair of adjacent ones of the word lines, are separate from each other lengthwise and widthwise, and one or more transfer transistors corresponding to another word line or other word lines are interposed between the any two transfer transistors.

According to still another aspect of the invention, there is provided a semiconductor memory device comprising: a memory cell array including electrically programmable non-volatile memory cells arranged in rows and columns; block select means for selecting one of blocks that are included in the memory cell array and each have a plurality of word lines; a plurality of word-line-driving-signal lines to receive voltages to be applied to a plurality of word lines in each block; and a plurality of transfer transistors connected between the word-line-driving-signal lines and the word lines of the memory cell array, the transfer transistors being controlled by outputs from the block select means, wherein a first element-isolation region, which is interposed between word-line-side terminals of some of the transfer transistors in the each block, has a narrower width than a second element-isolation region, which is interposed between word-line-side terminals and word-line-driving-signal line-side terminals of other transfer transistors in the each block.

According to still another aspect of the invention, there is provided a semiconductor memory device comprising: a memory cell array including a plurality of blocks, each of the blocks including electrically programmable nonvolatile memory cells arranged in rows and columns; a plurality of word-line-driving-signal lines to receive voltages to be applied to a plurality of word lines in each block; and block select circuit configured to select one of blocks that are included in the memory cell array and each have a plurality of word lines, the block select circuit includes a decoder section configured to decode row addresses assigned to the memory cell array, or pre-decode signals related to the row addresses, and a booster section configured to receive decode signals output from the decoder section, wherein any two of the transfer transistors, which correspond to each pair of adjacent ones of the word lines, are separate from each other lengthwise and widthwise, and one or more transfer transistors corresponding to another word line or other word lines are interposed between the any two transfer transistors.

DETAILED DESCRIPTION OF THE INVENTION

[First Embodiment]

Figure 3:
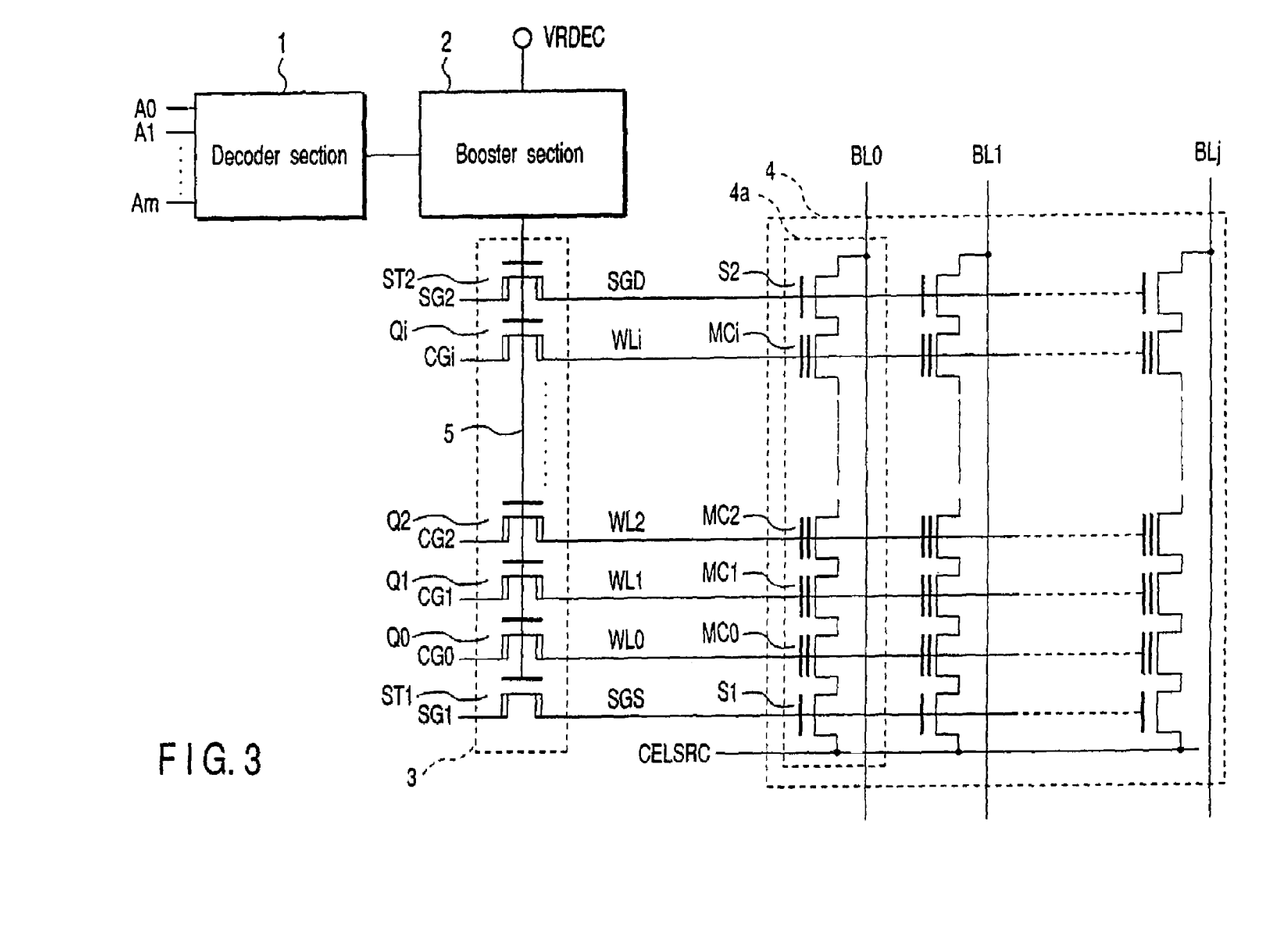
FIG. 3 is a circuit diagram useful in explaining a semiconductor memory device or NAND flash memory according to a first embodiment of the invention, illustrating an extracted part of a row decoder and a memory cell array employed therein.

FIG. 3 is a circuit diagram useful in explaining a semiconductor memory device or NAND flash memory according to a first embodiment of the invention, illustrating an extracted part of a row decoder and a memory cell array employed therein. This circuit comprises a decoder section 1, a booster section 2, a transfer transistor section 3 and a NAND cell block 4, etc.

A row address or a pre-decode signal A0, A1, . . . , Am related to the row address is supplied to the decoder section 1, where it is decoded. As a result, the decoder section 1 selects a NAND cell block 4 that is included in a memory cell array. A decode signal output from the decoder section 1 is supplied to the booster section 2. The booster section 2 controls a gate 5 incorporated in the transfer transistor section 3, so as to supply only the selected block 4 with word-line driving signals CG0 to CGi corresponding to the addresses of word lines, and select gate driving signals SG1 and SG2. The transfer transistor section 3 comprises transfer transistors Q0 to Qi for transfer-ring word-line driving signals CG0 to CGi to word lines WL0 to WLi, respectively, and transfer transistors ST1 and ST2 for transferring select gate driving signals SG1 and SG2 to select gate lines SGS and SGD, respectively. If the block 4 is selected, the booster section 2 responds to a decode signal output from the decoder section 1, thereby applying a predetermined voltage to the gate 5 of the transfer transistor section 3 to turn it on. On the other hand, if the block 4 is not selected, the gate 5 of the transfer transistor section 3 is set at a ground level, i.e. is turned off.

One NAND cell 4a included in the NAND flash memory comprises two select transistors S1 and S2 and memory cells MC0 to MCi. The gates of the select transistors S1 and S2 are connected to the select gate lines SGS and SGD, respectively. The current paths of the memory cells MC0 to MCi are connected in series between one end of the current path of the select transistor Si and one end of that of the select transistor S2. The gates (control gates) of the memory cells MC0 to MCi are connected to the word lines WL0 to WLi, respectively. The other end of the current path of the select transistor Si is connected to a source line CELSRC, while the other end of the current path of the select transistor S2 is connected to a bit line BL0 (BL1 to BLj).

When the cell block 4 has been selected by a row address or a pre-decode signal A0, A1, . . . , Am related to the row address, and an address assigned to one of the word lines WL0 to WLi has been selected, a corresponding one of the memory cells MC0 to MCi is accessed.

Figure 4:
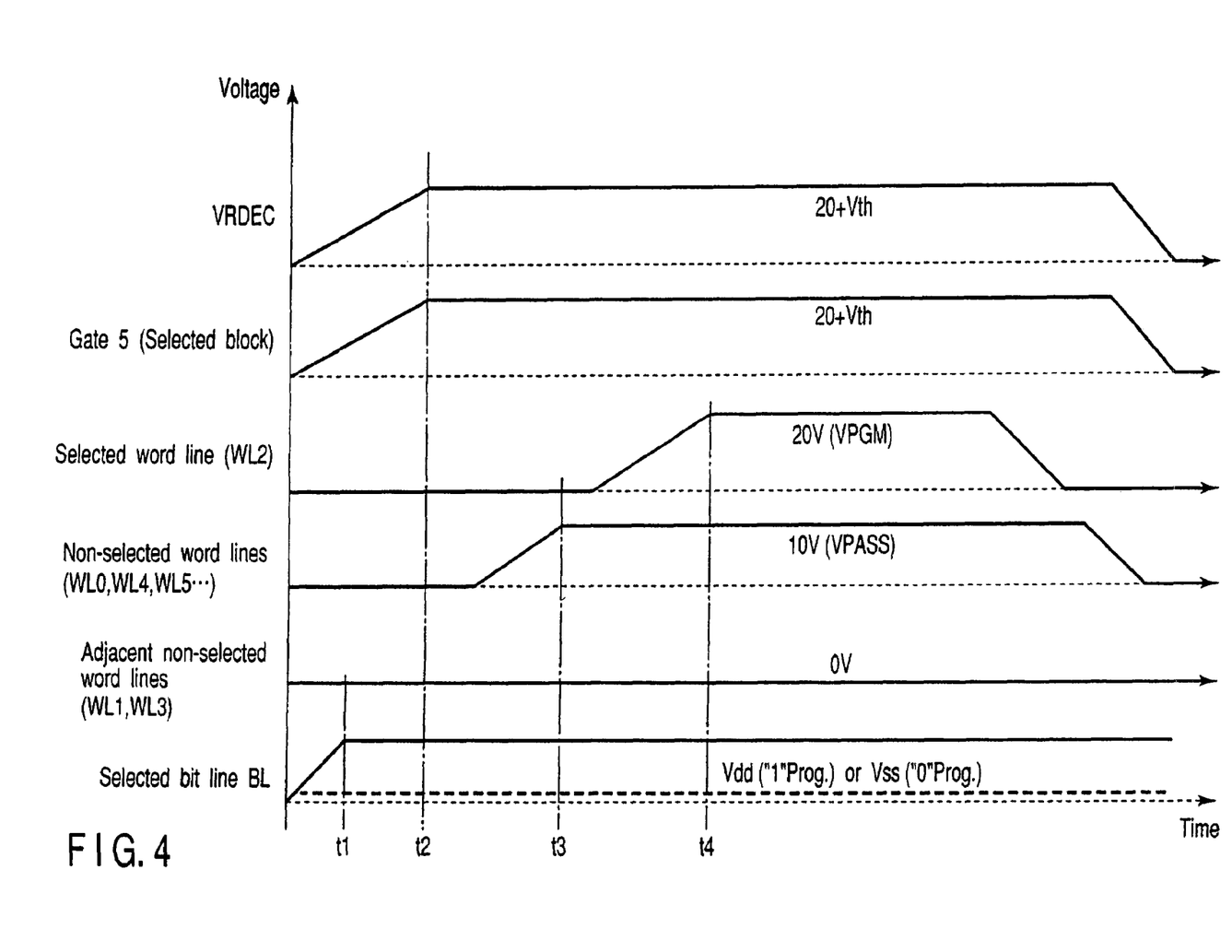
FIG. 4 is a timing chart of signals output when writing data in the NAND flash memory shown in FIG. 3.
Figure 5A:
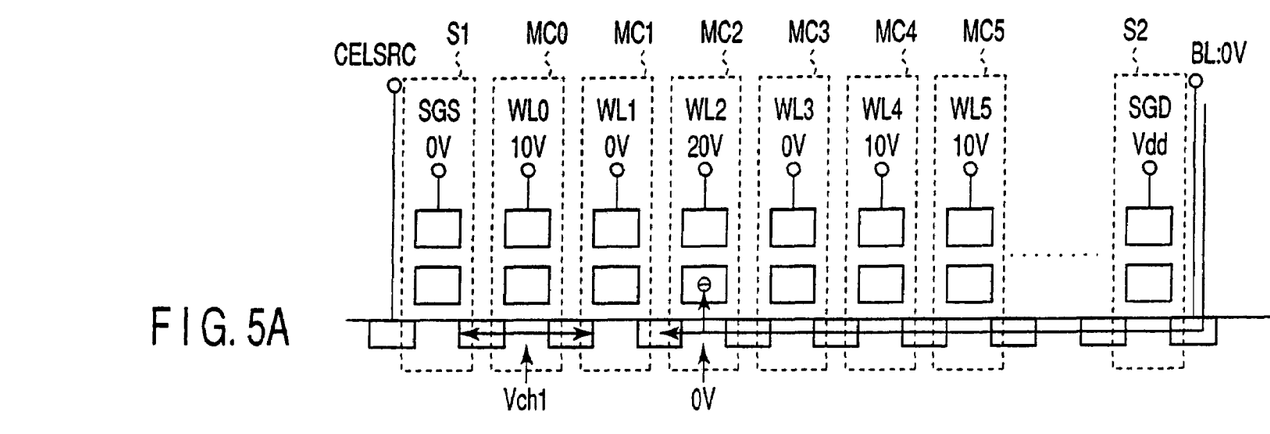
FIG. 5A is a schematic diagram useful in explaining the sectional configuration of a NAND cell included in the circuit of FIG. 3, and biasing conditions for writing data "0" into the NAND cell.
Figure 5B:
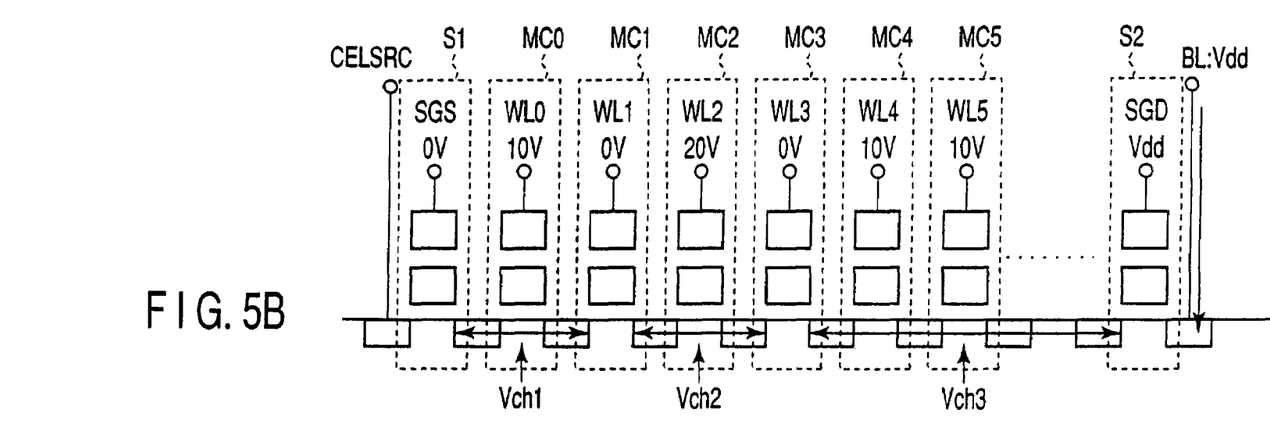
FIG. 5B is a schematic diagram useful in explaining the sectional configuration of the NAND cell included in the circuit of FIG. 3, and biasing conditions for writing data "1" into the NAND cell.

FIG. 4 is a timing chart of signals output in the NAND flash memory when writing data. Further, FIGS. 5A and 5B each show the sectional configuration of the NAND cell 4a and biasing conditions in the NAND cell 4a assumed when writing data. Specifically, FIG. 5A shows a state assumed when writing data "0" (programming data "0"), and FIG. 5B shows a state assumed when writing data "1" (programming data "0"). In the cases of FIGS. 5A and 5B, the memory cell MC2 is selected, and the word line WL2 is a selected word line. The other memory cells MC0, MC1, MC3, MC4, MC5, are all non-selected cells. In FIG. 4, the word lines WL1 and WL3 are non-selected word lines adjacent to the selected word line WL2, and the other word lines WL0, WL4, WL5, are non-selected word lines. In the writing method shown in FIG. 4, the NAND cell 4a is in the data-erased state (i.e. the threshold voltage of the memory cell transistor is negative) before writing data.

When writing data into a memory cell, at first, write data is transferred to a bit line BL connected thereto. In the NAND flash memory, writing operation is simultaneously executed on all memory cells selected by one word line, thereby increasing the writing speed. To realize this simultaneous writing, the flash memory has data latches of a unit, for example, 512 bytes, by which simultaneous writing is executed. These latches transfer a power supply voltage Vdd to a bit line BL connected to a cell into which "1" is to be written, and a ground voltage (0V) to a bit line connected to a cell into which "0" is to be written (t1). Further, in a selected block that includes a word line for writing data, when a row decoder driving voltage VRDEC has been applied to the memory device, a voltage, e.g. 22V, which is not less than the row decoder driving voltage VRDEC, is applied to the gate 5 of the transfer transistor section 3 (t2).

As a result, in the selected NAND cell, the power supply voltage Vdd is applied to the gate of the select transistor S2, and the channel of the NAND cell 4a is pre-charged through the bit line BL.

After that, a voltage VPASS of about 10V is applied to the non-selected word line WL0, WL4, WL5, . . . (t3).

As seen from FIG. 5A, when writing "0", the channel potential of the selected memory cell MC2, the select transistor S2 and the memory cells MC3, MC4, . . . located therebetween is maintained at 0V, since their threshold voltage is negative and hence they are connected to each other. On the other hand, as seen from FIG. 5B, when writing "1", the select transistor S2 is isolated since the bit line BL and the gate of the transistor S2 are set at the power supply voltage Vdd, and the NAND-cell side source of the transistor S2 is set at "Vdd-Vt". Accordingly, the channel potential of the NAND cell is increased by capacitive coupling in accordance with an increase in the potential of the non-selected word lines. Further, channel potentials Vch1 and Vch3 are increased to levels corresponding to the potential VPASS of the non-selected word lines. At this time, the channel potential Vch2 is not influenced by the potential of the word lines WL1 to WL3 since their potential is 0V, but is charged with a potential that is lower than the voltage Vch1 or Vch3 by the threshold voltage of the memory cells MC1 and MC3.

Subsequently, a write voltage (programming voltage) VPGM of about 20V is applied to the selected word line WL2 (t4).

When writing "0" into the memory cell MC2 as shown in FIG. 5A, the channel of the cell is connected to the bit line BL and kept at 0V, and hence a potential difference of 20V occurs between the word line WL2 and the channel. As a result, electrons are injected from the channel into the floating gate of the cell, thereby increasing its threshold voltage. In other words, writing is executed. When writing "1" into the memory cell MC2 as shown in FIG. 5B, the channel potential of the cell MC2 is switched from a floating state in which the cell MC2 is charged with a potential reduced by the threshold voltage of the memory cells MC1 and MC3, to a floating state of a higher potential caused by an increase in the potential of the word line WL2. Since the channel potential of the memory cell MC2 is thus increased in accordance with a potential change in the word line WL2, almost no electrons are injected from the channel to the floating gate, which means that the memory cell MC2 is kept in the state before writing.

Thus, writing of "0" and writing of "1" (i.e. non-writing) are executed. The row decoder transfers a selected word line voltage as stated above.

Figure 6:
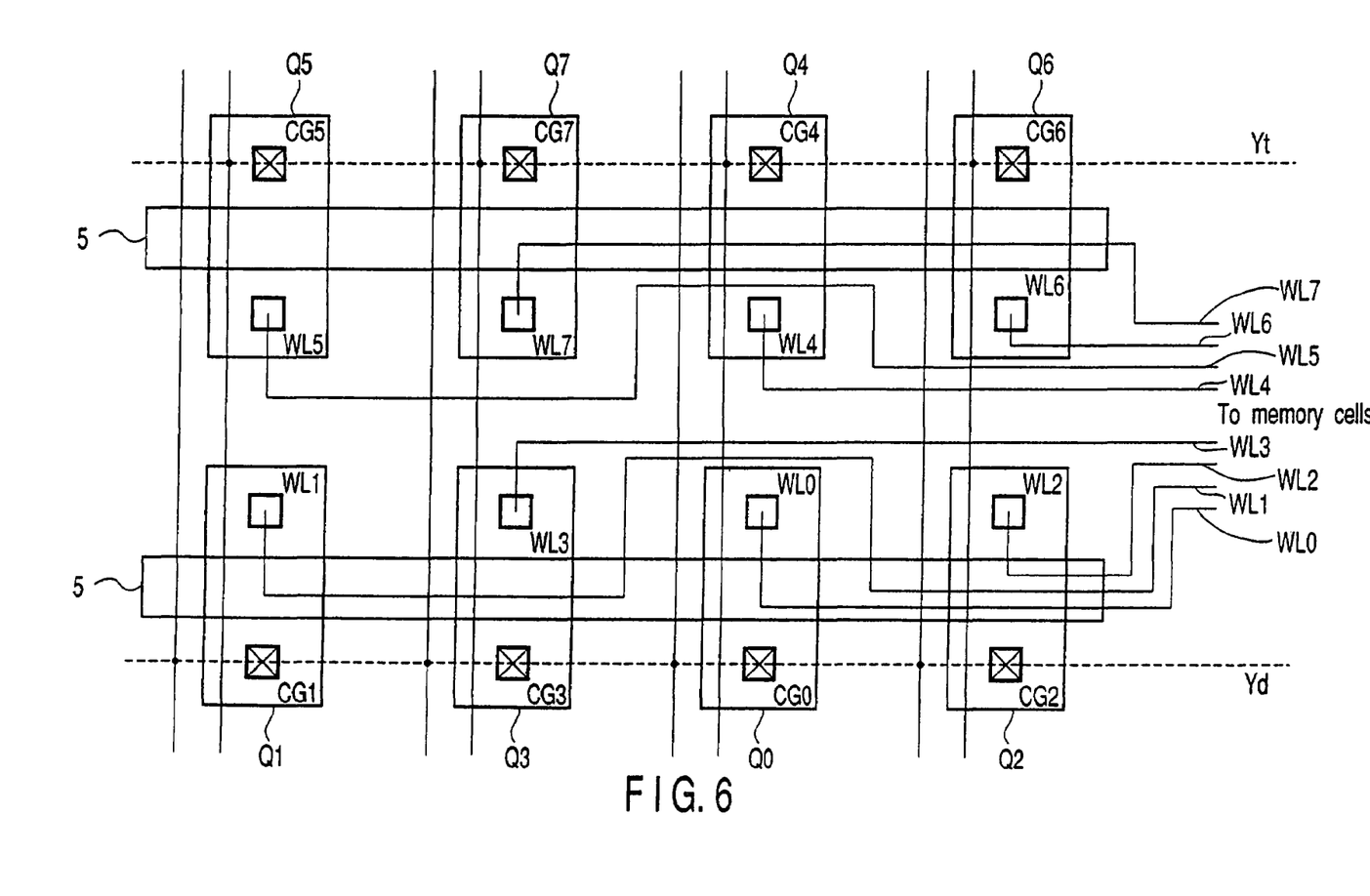
FIG. 6 is a plan view illustrating a pattern layout of transfer transistors employed in a row decoder shown in FIG. 3.

FIG. 6 is a plan view illustrating a pattern layout of the transfer transistors Q0 to Q7 employed in the row decoder according to the embodiment. The layout of FIG. 6 differs from the conventional layout of FIG. 1 in the arrangement of the transfer transistors Q0 to Q7.

Specifically, two transfer transistors corresponding to adjacent two word lines that have successive page address numbers are lengthwise and widthwise isolated from each other, and another transfer transistor connected to another word line is interposed therebetween. Further, address numbers assigned to word lines, which are connected to transfer transistors adjacent in the same column and row, are separate by 2 or more.

Figure 7:
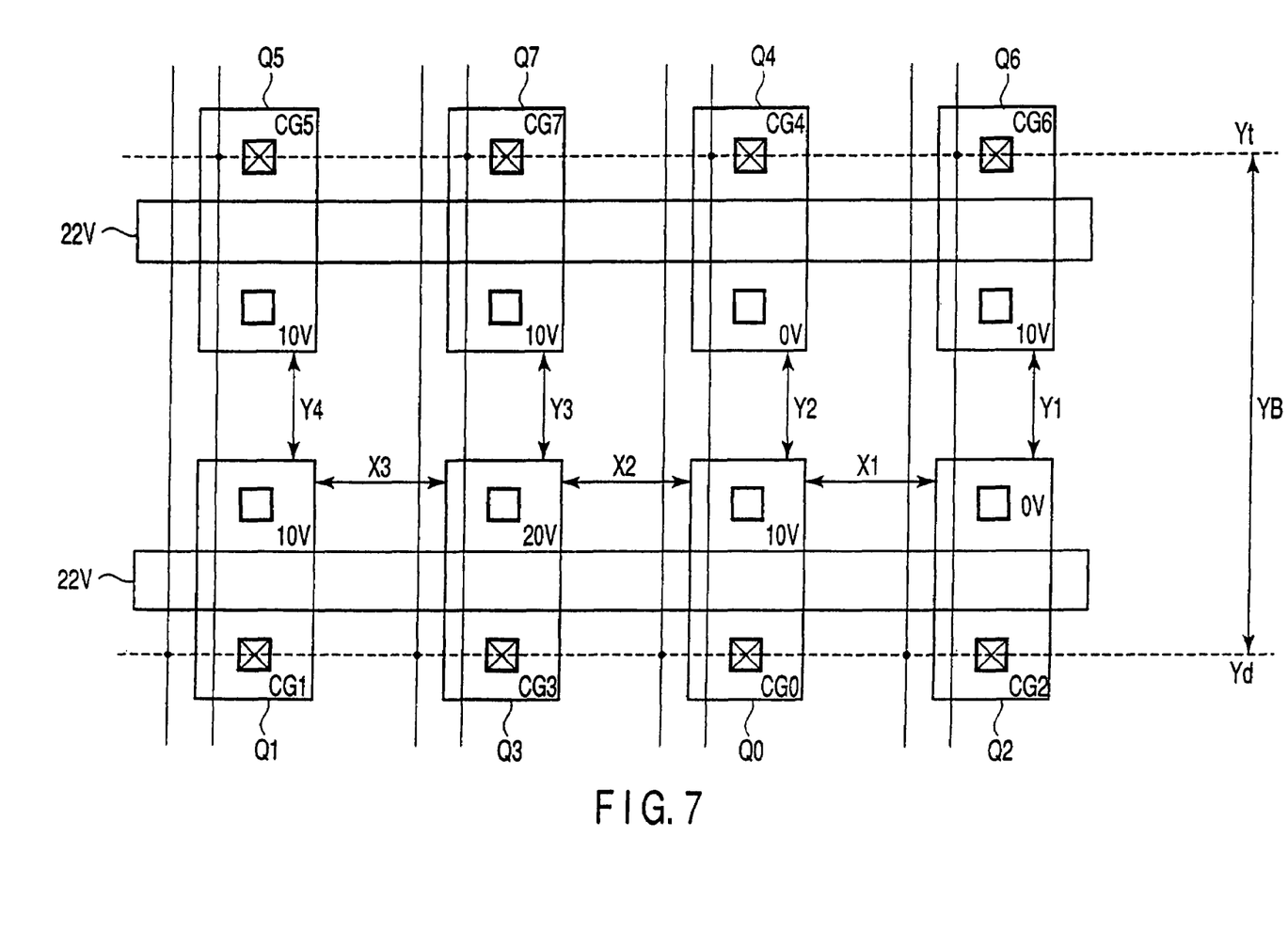
FIG. 7 is a plan view useful in explaining potential differences between the transfer transistors shown in FIG. 6.

FIG. 7 shows a voltage applied during the write operation where the word line WL3 corresponding to the word-line-driving signal CG3 is selected. As shown in FIGS. 6 and 7, in the lower stage formed of the transfer transistors Q0 to Q3, the transfer transistors Q1, Q3, Q0 and Q2, which correspond to CG1 (WL1), CG3 (WL3), CG0 (WL0) and CG2 (WL2), respectively, are arranged in this order. By virtue of this arrangement, the potential difference between the X-directionally adjacent transfer transistors is suppressed to 10V. Similarly, in the upper stage formed of the transfer transistors Q4 to Q7, the transfer transistors Q5, Q7, Q4 and Q6, which correspond to CG5 (WL5), CG7 (WL7), CG4 (WL4) and CG6 (WL6), respectively, are arranged in this order. By virtue of this arrangement, the potential difference between the X-directionally adjacent transfer transistors, also between the Y-directional transfer transistors Q0 and Q4 and between Y-directional transfer transistors Q3 and Q7 is suppressed to 10V. Not only in the case of FIG. 7, but also where any word line is selected, the potential difference between X-directionally or Y-directionally adjacent transfer transistors is suppressed to 10V.

Accordingly, when employing the writing system shown in FIGS. 4, 5A and 5B, potential differences that occur between transfer transistors in any block can be minimized. This means that it is sufficient if the size around the transfer transistors Q0 to Q7 provided in the row decoder, for example, the length of each element-isolation region (distances X1 to X3 and Y1 to Y4), is set at a value that enables each element-isolation region to resist 10V or more. In other words, the length of each element-isolation region can be made narrower than the conventional one, and therefore the pattern area of the row decoder can be reduced.

The assignment of addresses to the word lines WL0 to WL7 of the transfer transistor section 3, shown in FIGS. 6 and 7, is just an example and may be changed. It is sufficient if addresses assigned to word lines connected to transfer transistors adjacent in the X or Y direction are not continuous with each other.

In particular, in actual layouts, there is a case where the assignment of addresses as shown in FIG. 6 is impossible, from the design rule demanding that each word line must be led from the word-line-side terminal of a corresponding transfer transistor Q0 to Q7. Therefore, it is necessary to select an optimal address assignment in light of the wiring rule.

FIG. 6 shows a layout pattern obtained by leading a tungsten wire from each word-line-side terminal of the transfer transistor section 3 to the memory-cell side. As shown in FIG. 6, the led tungsten wires are connected to polysilicon wires or polycide wires serving as word lines, so that the tungsten wires are arranged in the order corresponding to addresses assigned thereto. As the pitch of word lines is determined on the basis of the strictest design rule, it is necessary to accurately order the word lines of the memory cell array with respect to the wires led from the transfer transistors, in order to facilitate their connection. Furthermore, it is desirable that the leading wires should be formed of only a metal wiring layer closest to a word-line layer (which is, in this case, polysilicon wiring or polycide wiring) that serves as the control gate of each memory cell. This is because if the number of metal wiring layers, which are connected to form each leading wire, is increased, the word lines, connected to the leading wires and serving as the control gates of the nonvolatile memory, are subjected to a via contact process while they are in a floating state. This may damage the memory cells. To avoid this, it is desirable that the aforementioned address assignment should be realized, without intersecting the leading wires that extend from the transfer transistors to the word lines, but by, for example, the method shown in FIG. 6.

As described above, if the leading wires, which extend from the word-line-side terminals of the transfer transistors in each block to the respective word lines of the memory array, are led such that they are accurately ordered with respect to the word lines, they can be easily connected to the word lines that are formed on the basis of the strictest design rule.

Also, if the leading wires, which extend from the word-line-side terminals of the transfer transistors to the respective word lines, are formed of only a metal wiring layer provided above and closest to the wiring layer that is formed into the word lines, a process damage on the word lines, i.e. the control gates of the nonvolatile memory, can be reduced as compared with a case where the leading wires are each formed by connecting a plurality of metal wiring layers included in the memory device.

As stated above, forming transfer transistors in an appropriate pattern enables the distances between the transfer transistors to be minimized, and hence enables the pattern area of the row decoder to be reduced.

[Second Embodiment]

Figure 8:
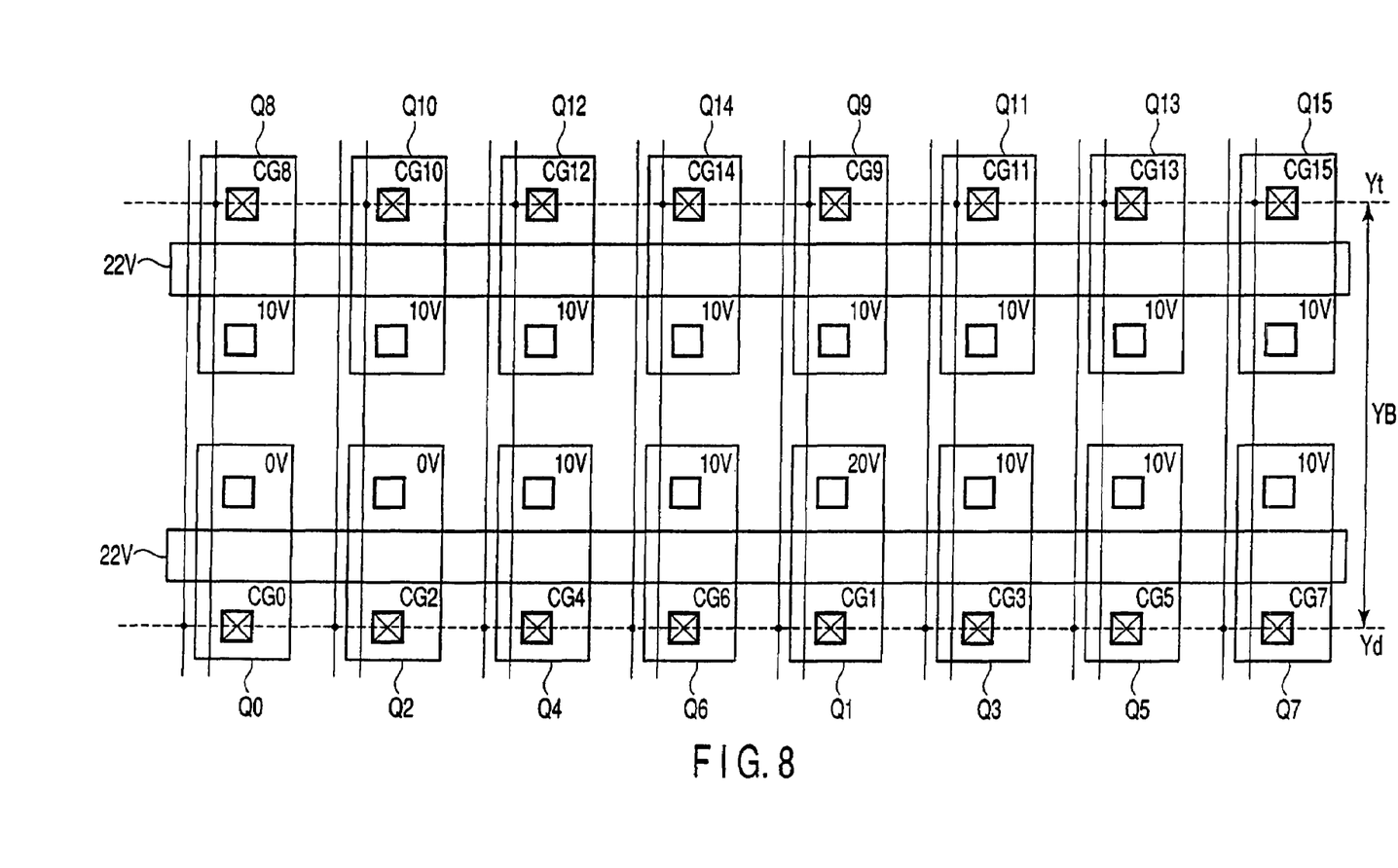
FIG. 8 is a plan view useful in explaining a semiconductor memory device according to a second embodiment of the invention, illustrating a layout pattern example of sixteen transfer transistors used as the memory cells of a NAND cell connected in series.

FIG. 8 is a plan view useful in explaining a semiconductor memory device according to a second embodiment of the invention, illustrating a layout pattern example of sixteen transfer transistors Q0 to Q15 used as the memory cells of a NAND cell connected in series. The other basic configurations and functions are similar to those in the above-described first embodiment. FIG. 8 shows a voltage applied during the write operation where the word line WL1 corresponding to the word-line-driving signal CG1 is selected. Although FIG. 8 does not include reference numerals that denote word lines, the other-end-side node of each word-line-driving-signal line CGi functions as a word-line-side terminal.

As shown in FIG. 8, in the lower stage formed of the transfer transistors Q0 to Q7, the transfer transistors Q0, Q2, Q4, Q6, Q1, Q3, Q5 and Q7, which correspond to CG0 (WL0), CG2 (WL2), CG4 (WL4), CG6 (WL6), CG1 (WL1), CG3 (WL3), CG5 (WL5) and CG7 (WL7), respectively, are arranged in this order. By virtue of this arrangement, the potential difference between the X-directionally adjacent transfer transistors is suppressed to 10V or less. Similarly, in the upper stage formed of the transfer transistors Q8 to Q15, the transfer transistors Q8, Q10, Q12, Q14, Q9, Q11, Q13 and Q15, which correspond to CG8 (WL8), CG10 (WL10), CG12 (WL12), CG14 (WL14), CG9 (WL9), CG11 (WL11), CG13 (WL13) and CG15 (WL15), respectively, are arranged in this order. By virtue of this arrangement, the potential difference can be suppressed to 10V or less between the X-directionally adjacent transfer transistors Q8, Q10, Q12, Q14, Q9, Q11, Q13 and Q15. Also between the Y-directionally adjacent transfer transistors, only a potential difference of 10V is applied.

As is evident from the pattern layout of FIG. 8, continuous addresses are not assigned to word lines connected to vertically and horizontally adjacent transfer transistors, as in the case shown in FIGS. 6 and 7. Moreover, in the second embodiment, continuous addresses are not assigned to the word lines WL0 to WL15, which include word lines connected even to obliquely adjacent transfer transistors, as well as those connected to the vertically and horizontally adjacent transfer transistors.

Consequently, in the second embodiment, even the sixteen transfer transistors Q0 to Q15, which serve as the memory cells of a NAND cell connected in series, can be arranged appropriately. This means that it is not necessary to widen the distance between each pair of adjacent transfer transistors Q0 to Q15, and hence the pattern area of the row decoder can be reduced.

[Third Embodiment]

Figure 9:
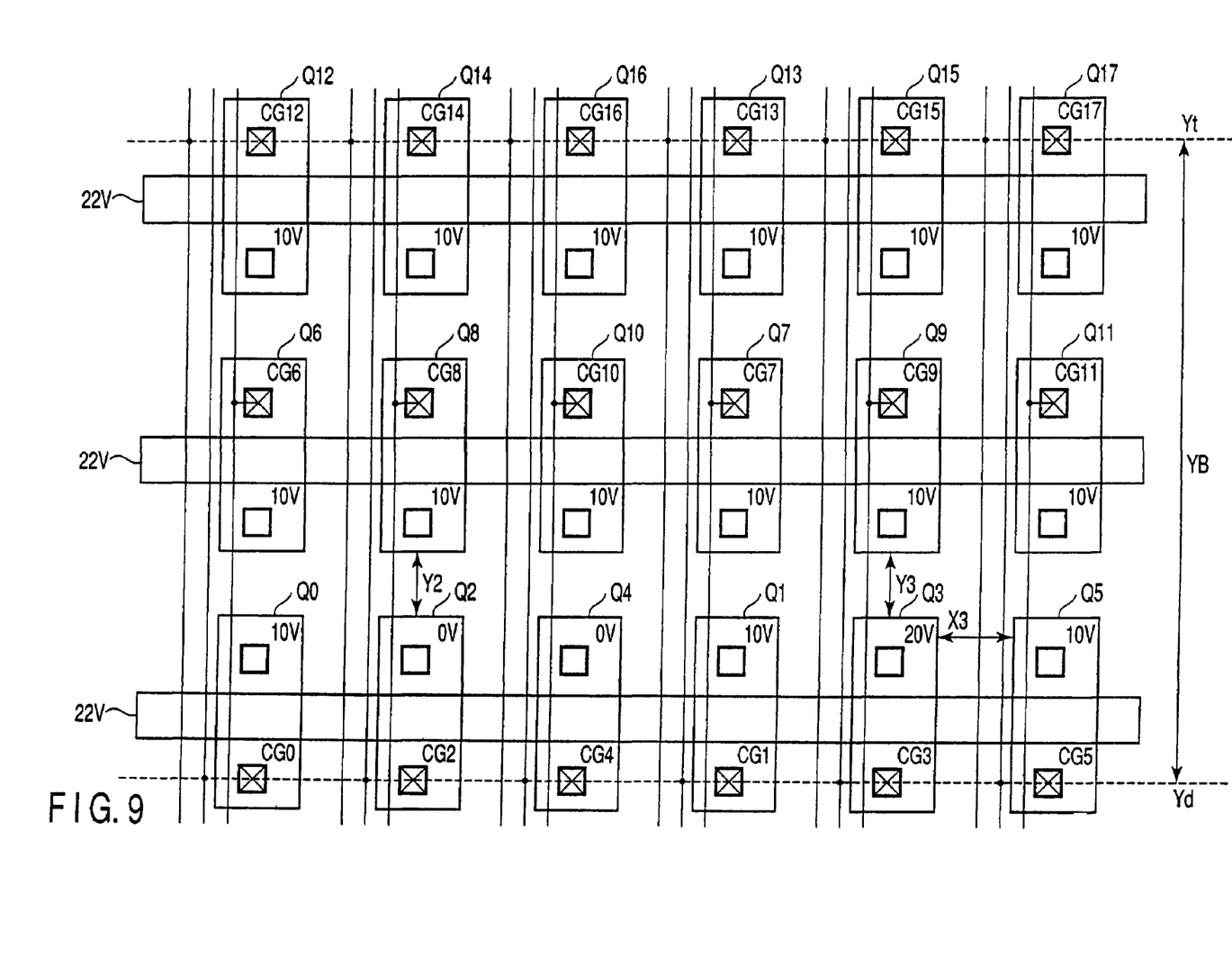
FIG. 9 is a plan view useful in explaining a semiconductor memory device according to a third embodiment of the invention, illustrating a layout pattern example of transfer transistors included in a NAND cell and arranged in three stages.

FIG. 9 is a plan view useful in explaining a semiconductor memory device according to a third embodiment of the invention, illustrating a layout pattern example of transfer transistors included in a NAND cell and arranged in three stages. The other basic configurations and functions are similar to those of the above-described first embodiment. FIG. 9 shows a voltage applied during the write operation where the word line WL3 corresponding to the word-line-driving signal CG3 is selected.

As aforementioned, a NAND memory cell comprises memory cells having their current paths connected in series, and two select transistors serving as overheads for one memory cell. Accordingly, to reduce the size of the memory cell array, it is considered very effective to reduce the number of select transistors such that, for example, two select transistors are provided for every eight memory cells, or for every sixteen memory cells or thirty two memory cells.

However, if the number of memory cells connected in series is increased, the distance YB between the broken lines Yt and Yd is increased. Therefore, in order to reduce the pattern area of the row decoder, it is effective to increase the number of transfer transistors located in the Y direction, i.e. the number of stages, thereby reducing the X-directional length of the row decoder. To this end, in the third embodiment shown in FIG. 9, the transfer transistors are arranged in three stages.

Specifically, as seen from FIG. 9, in the lower stage formed of transfer transistors Q0 to Q5, the transfer transistors Q0, Q2, Q4, Q1, Q3 and Q5, which correspond to CG0 (WL0), CG2 (WL2), CG4 (WL4), CG1 (WL1), CG3 (WL3) and CG5 (WL5), respectively, are arranged in this order. By virtue of this arrangement, the potential difference between the X-directionally adjacent transfer transistors is suppressed to 10V. Similarly, in the middle stage formed of transfer transistors Q6 to Q11, the transfer transistors Q6, Q8, Q10, Q7, Q9 and Q11, which correspond to CG6 (WL6), CG8 (WL8), CG10 (WL10), CG7 (WL7), CG9 (WL9) and CG11 (WL11), respectively, are arranged in this order. By virtue of this arrangement, the potential difference between the X-directionally adjacent transfer transistors is suppressed to 10V if any one of the word lines is selected. Further, in the upper stage formed of transfer transistors Q12 to Q17, the transfer transistors Q12, Q14, Q16, Q13, Q15 and Q17, which correspond to CG12 (WL12), CG14 (WL14), CG16 (WL16), CG13 (WL13), CG15 (WL15) and CG17 (WL17), respectively, are arranged in this order. By virtue of this arrangement, the potential difference between the X-directionally adjacent transfer transistors is suppressed to 10V if any one of the word lines is selected. Moreover, the potential difference between the Y-directionally adjacent transfer transistors of the lower and middle stages or of the middle and upper stages is also suppressed to 10V if any word line is selected.

Figure 10:
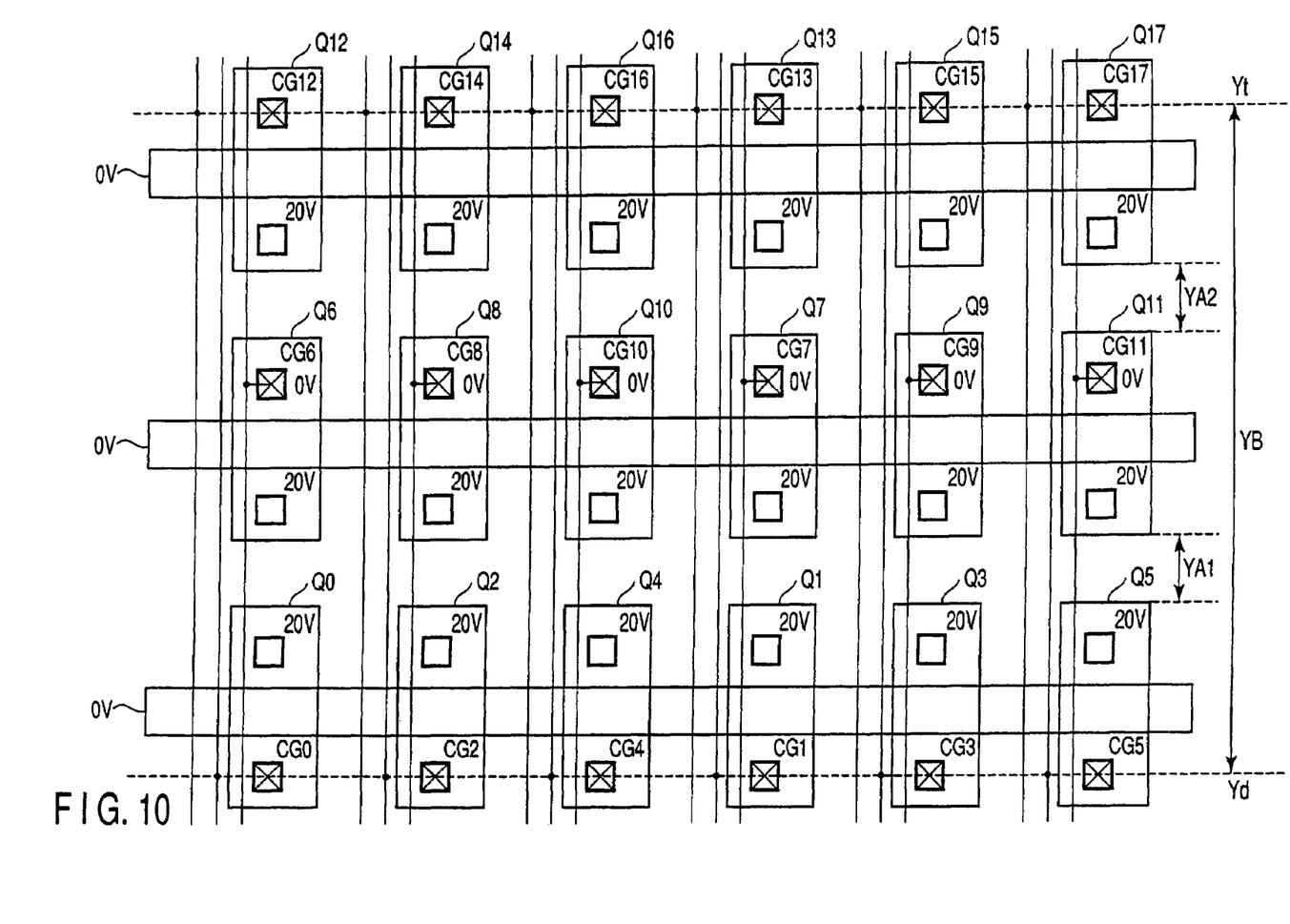
FIG. 10 is a plan view useful in explaining potential differences between the transfer transistors shown in FIG. 9, executing a biased state assumed when an erasure operation is executed in a non-selected block.

In the case of this pattern layout, the word-line-driving signal terminals of some transfer transistors face the word-line-side terminals of other transfer transistors. FIG. 10 shows a biased state assumed when an erasure operation is executed in a non-selected block. In this state, the word-line driving signal CG6, CG8, CG10, CG7, CG9 and CG11 terminals of the transfer transistors Q6, Q8, Q10, Q7, Q9 and Q11 arranged in the middle stage are at 0V, while the word-line-side terminals of the transfer transistors Q12, Q14, Q16, Q13, Q15 and Q17 arranged in the upper stage are at 20V.

Figure 11A:
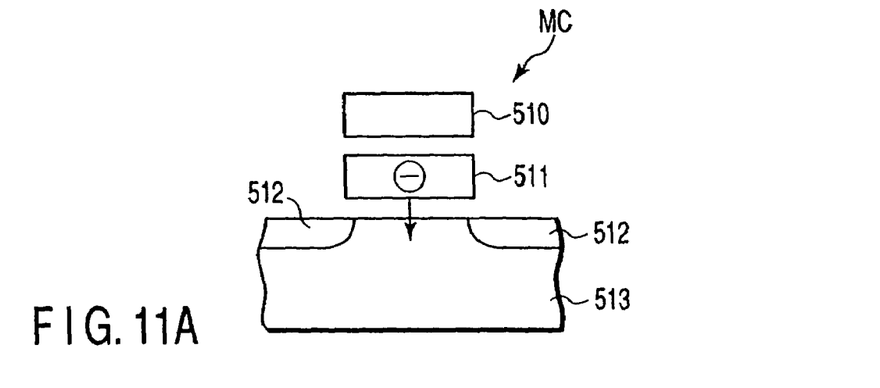
FIG. 11A is a sectional view of a memory cell, useful in explaining an erasure operation.

This is because, at the time of erasure, 0V is applied to all of the word-line driving signal CG0 to CGi terminals so as to set, at 0V, the level of the word lines of a selected block. In non-selected blocks, since the gate 5 of the transfer transistor section 3 is grounded, the word-line-side node is in a floating state. In a biased state assumed at the time of erasure, 20V is applied to a p-well region (cell p-well region) 513 in which each memory cell transistor MC is formed, as shown in FIG. 11A, while the level of all the word lines of a selected block is set at 0V. As a result, a potential difference of 20V occurs between the control gate (word line) 510 of each memory cell transistor MC and the cell p-well region 513, and electrons are discharged from the floating gate 511 of the cell into the channel region (the portion of the cell p-well region 513, which is located inside the source/drain region 512 of the cell) of the cell.

On the other hand, in a non-selected block in which the erasure operation is executed, since the word lines are in a floating state, if 20V is applied to the cell p-well region 513, the potential of the word lines in the floating state is increased as a result of capacitive coupling, whereby a potential difference sufficient for erasure does not occur between the control gate 510 and cell p-well region 513 of each memory cell transistor MC, and no erasure is executed. Accordingly, as shown in FIG. 10, in a non-selected block in which the erasure operation is executed, the word-line-side terminal of each transfer transistor is at 20V substantially equal to the erasure voltage.

Figure 11B:
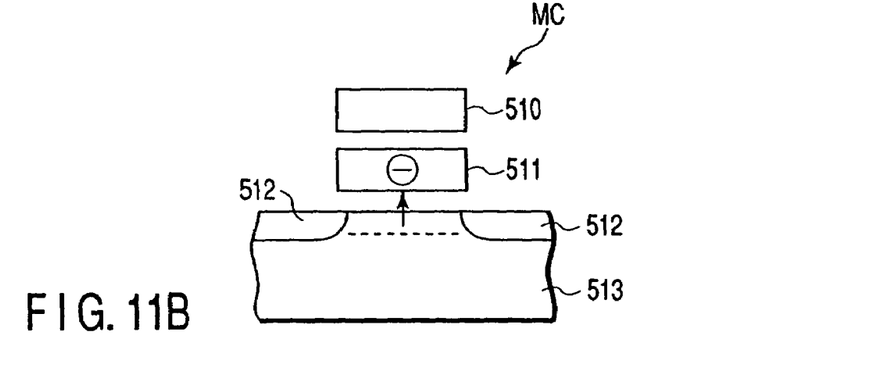
FIG. 11B is a sectional view of a memory cell, useful in explaining a write operation.
Figure 11C:
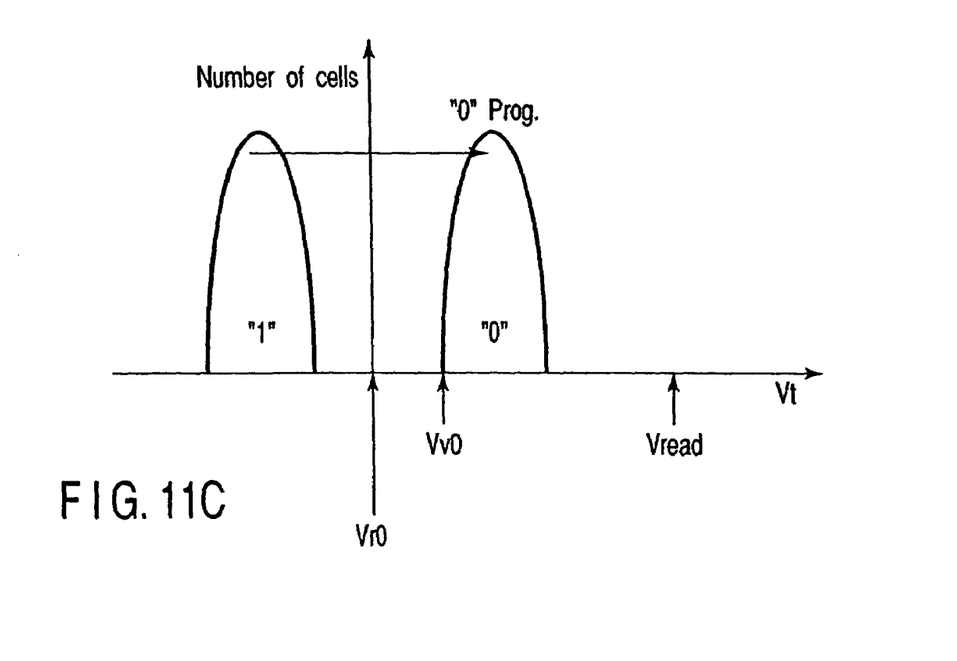
FIG. 11C is a graph illustrating threshold value distributions assumed before and after the write operation.

When writing data, as shown in FIG. 11B, 0V is applied to the p-well region (cell p-well region) 513 in which each memory cell transistor MC is formed, and 20V is applied to the control gate (word line) 510 of each memory cell transistor MC. As a result, electrons are injected from the channel region into the floating gate 511. Consequently, the threshold voltage distribution of each memory cell transistor MC is shifted as shown in FIG. 11C after writing data. (in the case of writing "0").

Accordingly, in the case of FIG. 10, a potential difference of about 20V occurs between the Y-directionally adjacent transfer transistors of the middle stage and the upper stage. Therefore, in this case, the length YA2 of an element-isolating region between the upper stage and the middle stage is set longer than the length YA1 of an element-isolating region between the middle stage and the lower stage. The size of the transfer transistor region can be minimized by setting the lengths YA2 and YA1 at respective optimal values.

In the above-described configuration of the row decoder, in which transfer transistors of a single block are arranged in three or more stages, where the potential difference between transfer transistors is small, the element-isolation region therebetween is made small, whereas where the potential difference is large, the element-isolation region therebetween is made large. Thus, there is no too-large element-isolation region. It is not avoidable to enlarge the element-isolation region, in particular, if the word-line-side terminals of transfer transistors face the word-line-driving-signal terminals of transfer transistors with the element-isolation region interposed therebetween. However, in the other portions of the row decoder, address assignment is executed so as to minimize a potential difference that occurs in each element-isolation region between transfer transistors, with the result that the row decoder can be made to an optimal size.

As described above, according to an aspect of the present invention, there is provided a semiconductor memory device, in which transfer transistors are appropriately arranged, and accordingly the distances therebetween and the pattern area of the row decoder are reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array including a plurality of memory cells arranged in rows and columns, the memory cell array having a plurality of blocks wherein within each block memory cells are arranged; and
a word-line select circuit including transfer transistors arranged in row and column directions, and configured so as to transfer a plurality of different voltages to word lines through a current path of the transfer transistors and select memory cells in at least one row of said plurality of blocks, the transfer transistors including a first transistor which transfers the lowest voltage of voltages applied to the word lines in a writing operation, a second transistor which transfers the highest voltage of the voltages applied to the word lines in a writing operation, and a third transistor, which is arranged between the first transistor and the second transistor, and which is applied with an intermediate voltage between the highest voltage and the lowest voltage during a writing operation.

2. The semiconductor memory device according to claim 1, wherein said plurality of blocks an NAND cell blocks, respectively, one NAND cell including the memory cells.

3. The semiconductor device according to claim 2, wherein the NAND cell includes the memory cells having current paths thereof connected in series and a select transistor connected to at least one of one end and another end of the memory cells having current paths thereof connected in series.

4. The semiconductor memory device according to claim 2, wherein the highest voltage is a write voltage, and the lowest voltage is a voltage which separates a voltage of a channel region which includes the memory cells to which the write voltage is applied and a voltage of a channel region which includes the other memory cells to which a voltage between the highest voltage and the lowest voltage is applied, in the NAND cell selected by the word-line select circuit.

5. The semiconductor memory device according to claim 1, wherein the highest voltage is a write voltage.

* * * * *

UNITED STATES PATENT AND TRADEMARK OFFICE
CERTIFICATE OF CORRECTION

PATENT NO. : 6,972,996 B2 Page 1 of 1
APPLICATION NO. : 10/922950
DATED : December 6, 2005
INVENTOR(S) : Koji Hosono et al.

It is certified that error appears in the above-identified patent and that said Letters Patent is hereby corrected as shown below:

Column 12,
Line 5, replace "an" with -- are --.

Signed and Sealed this

Twenty-seventh Day of June, 2006

JON W. DUDAS
*Director of the United States Patent and Trademark Office*